US007239253B1

(12) United States Patent
Denninghoff

(10) Patent No.: US 7,239,253 B1
(45) Date of Patent: Jul. 3, 2007

(54) CODEC SYSTEM AND METHOD

(75) Inventor: Karl Denninghoff, Bothell, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/943,112

(22) Filed: Sep. 16, 2004
(Under 37 CFR 1.47)

Related U.S. Application Data

(60) Provisional application No. 60/509,282, filed on Oct. 6, 2003, provisional application No. 60/504,169, filed on Sep. 18, 2003, provisional application No. 60/504,421, filed on Sep. 18, 2003.

(51) Int. Cl.
*H03M 7/00* (2006.01)

(52) U.S. Cl. ........................ 341/50; 341/200; 370/522

(58) Field of Classification Search ................ 341/155, 341/50, 118, 126, 200; 704/204; 382/239, 382/240; 370/522
See application file for complete search history.

(56) References Cited

U.S. PATENT DOCUMENTS 4,455,649 A * 6/1984 Esteban et al. ............. 370/522
5,913,186 A * 6/1999 Byrnes et al. ............. 704/204
5,987,181 A * 11/1999 Makiyama et al. ......... 382/239
6,215,907 B1 * 4/2001 Kumar et al. ............... 382/240
6,441,764 B1 * 8/2002 Barron et al. ............... 341/155

* cited by examiner

*Primary Examiner*—Jean Bruner Jeanglaude
(74) *Attorney, Agent, or Firm*—Blakely, Sokoloff, Taylor & Zafman LLP

(57) ABSTRACT

A sound codec including a compression portion and a decompression portion. The compression portion separates the incoming sound packet bandwidth into frequency sub-bands using a bank of infinite impulse response (IIR) filters. In accordance with the invention, the lower frequency signals are divided into more sub-bands than the higher frequency signals. Once the signals are divided into sub-bands, each sub-band signal is quantized. The resulting signals of all of the quantized sub-bands are then sent out over a communications link along with the filter state at the end of each sound packet. The decompression portion recombines the individual sub-band signals together (using a bank of infinite impulse response (IIR) filters) to form the audio data using the filter states to configure the reconstruction.

26 Claims, 7 Drawing Sheets

CODEC SYSTEM AND METHOD

PRIORITY CLAIM

This patent application claims priority under 35 USC 119(e) from 1) U.S. Provisional Patent Application Ser. No. 60/504,169 filed on Sep. 18, 2003 and entitled "Codec System and Method"; 2) U.S. Provisional Patent Application Ser. No. 60/509,282 filed on Oct. 6, 2003 and entitled "Group Intercom, Delayed Playback, and Ad-Hoc Based Communications System and Method"; and 3) U.S. Provisional Patent Application Ser. No. 60/504,421 filed on Sep. 18, 2003 and entitled "Globally Unique Identification in Communications Protocols and Databases", all three of which are incorporated herein by reference.

APPENDIX A

Appendix A (99 pages including cover sheet), which is incorporated into this specification, contains the source code for 1) a preferred embodiment of a compression module; and 2) a preferred embodiment of a decompression module that implement the codec system and method in accordance with the invention.

FIELD OF THE INVENTION

The invention relates generally to a digital data compressor/decompressor (codec) and in particular to a novel software-based system and method for compressing and/or decompressing sound data.

BACKGROUND OF THE INVENTION

Digital data compression/decompression techniques are well known. The techniques are typically implemented in hardware or software or a combination of these. The software module/hardware module or device that performs these functions is typically referred to as a codec. A codec may be used to compress/decompress various types of data including, for example, video data, image data, images and audio data. It is desirable to compress this type of data so that it can be transmitted over a communications link with limited bandwidth, such as a modem connection, DSL line or the like. In general, a higher level of compression (reduction in the total size of the video or audio data) results in greater image/sound quality losses.

In the context of sound data, it is desirable to compress/decompress the data as it is being communicated over a wireless link, which has a very limited bandwidth capability. Some communication systems utilize a digital signal processor (DSP), which is a specialized processor chip that performs compression and decompression functions. A DSP is able to quickly and efficiently compress/decompress the sound data. However, for most applications, it is not feasible to have a DSP located in the device that is performing the sound compression/decompression. Therefore, it is necessary to perform the compression/decompression functions in a software-based solution. With a software-based solution, some hardware-based techniques cannot be used because those hardware-based techniques are too cumbersome from a computation standpoint. Thus, it is desirable to provide a novel software-based sound codec system and method and it is to this end that the present invention is directed.

SUMMARY OF THE INVENTION

A software-based codec is described. The codec may be present on different computing resources or the same computing resource in that the compression may occur on a first computer and then the decompression may occur on a second computer or both the compression and decompression may occur on the same computer. For a voice conversation using voice over IP ("VoIP") technology, there may be a sender and a receiver. For the voice data going from the sender to the receiver, the sender compresses the audio data and the receiver decompresses the audio data. For the voice going from the receiver to the sender, the reverse happens so that both the sender and receiver compress and decompress audio data. The codec may thus include a compression portion and a decompression portion. The compression portion separates the incoming sound energy (having a particular bandwidth) into sub-bands using a bank of infinite impulse response (IIR) filters. In accordance with the invention, the lower frequency signals are divided into more sub-bands than the higher frequency signals. Once the signals are divided into sub-bands, each sub-band signal is quantized. The resulting signals of all of the quantized sub-bands are then sent out over a communications link.

At the decompression portion, the individual sub-band signals are recombined together to form the audio data. In more detail, the sub-band samples are reverse quantized and then fed back through a bank of IIR filters to reconstruct the original audio data. In accordance with the invention, the IIR filters in the decompressor are run in a reverse direction to achieve the reconstruction without the non-linear phase shift normally associated with the use of IIR filters.

In accordance with the invention, an apparatus and method for compressing a data stream is provided. The apparatus has a bank of filters and a plurality of quantizers. The bank of filters separate a data stream having a higher frequency portion and a lower frequency portion into a plurality of sub-bands wherein each sub-band comprises a portion of the data stream within a particular frequency range. The plurality of sub-bands cover the frequency range of the data stream and the lower frequency portion is divided into more sub-bands than the higher frequency portion. Each quantizer receives a particular sub-band from a particular filter and quantizing the particular sub-band signal to generate a sub-band quantized signal having quantizer noise wherein the quantizer noise for a particular sub-band signal is masked by the amplitude of the signal in the sub-band. The sub-band quantized signals of the plurality of quantizers are combined together to form a compressed output signal.

In accordance with another aspect of the invention, an apparatus and method for decompressing a compressed data stream having a plurality of quantized frequency sub-bands is provided where the decompressor has a plurality of decoders and a bank of filters. In the decompressor, each decoder receives a particular quantized frequency sub-band of the compressed data stream and then reverse quantizes the particular quantized frequency sub-band to generate a decoded frequency sub-band signal wherein the quantizer noise for a particular sub-band signal is masked by the amplitude of the signal in the sub-band. The plurality of decoders generate a plurality of decoded frequency sub-band signals at a plurality of sub-bands. The bank of filters reconstruct the plurality of decoded frequency sub-band signals at a plurality of sub-bands into an uncompressed data stream wherein each sub-band signal comprises a portion of the data stream within a particular frequency range so that the plurality of sub-bands cover the frequency range of the data stream and wherein a lower frequency portion is divided into more sub-bands than a higher frequency portion. Each filter receives a filter state from the compressed data stream in order to reconstruct a sequence of data packets in the particular decoded frequency sub-band signal in reverse order to generate the uncompressed data stream.

In accordance with yet another aspect of the invention, a personal computing device for use within a communications network is provided. The device has a communications application, being executed by a processor of the personal computing device, that can establish a communication session with a communications application of another personal computing device over a communications network. The communications application further comprises a sound manager module that receives outgoing sound data and incoming sound data wherein the sound manager module has a codec with a compression module and a decompression module. The compression module further comprises a bank of filters wherein the bank of filters separate a data stream having a higher frequency portion and a lower frequency portion into a plurality of sub-bands wherein each sub-band comprises a portion of the data stream within a particular frequency range so that the plurality of sub-bands cover the frequency range of the data stream. In accordance with the invention, the lower frequency portion is divided into more sub-bands than the higher frequency portion. The compression module also has a plurality of quantizers wherein each quantizer receives a particular sub-band from a particular filter and quantizes the particular sub-band signal to generate a sub-band quantized signal having quantizer noise wherein the quantizer noise for a particular sub-band signal is masked by the amplitude of the signal in the sub-band. The sub-band quantized signals of the plurality of quantizers are combined together to form a compressed output signal. The decompression module further comprises a plurality of decoders that receive a compressed data stream wherein each decoder receives a particular quantized frequency sub-band of the compressed data stream and reverse quantizes the particular quantized frequency sub-band to generate a decoded frequency sub-band signal wherein the plurality of decoders generate a plurality of decoded frequency sub-band signals at a plurality of sub-bands. The decompression module further comprises a bank of filters wherein the bank of filters reconstruct the plurality of decoded frequency sub-band signals at a plurality of sub-bands into an uncompressed data stream having a plurality of frequencies corresponding to the frequencies of the sub-band signals wherein each filter receives a filter state from the compressed data stream in order to reconstruct a sequence of data packets in the particular decoded frequency sub-band signal in reverse order to generate the uncompressed data stream.

DETAILED DESCRIPTION OF A PREFERRED EMBODIMENT

The invention is particularly applicable to a software-based audio sound compression/decompression (codec) for a voice over IP (VoIP) wireless communications system and it is in this context that the invention will be described. It will be appreciated, however, that the software-based codec in accordance with the invention described herein has greater utility since it may be used in other systems in which it is desirable to provide data compression and decompression and in particular may be used to compress or decompress various types of data, including but not limited to video, audio-visual, images, etc . . . . Prior to describing the codec in accordance with the invention, an example of a system that may utilize the codec, such as an exemplary voice of IP communications system, will be described.

Figure 1A:
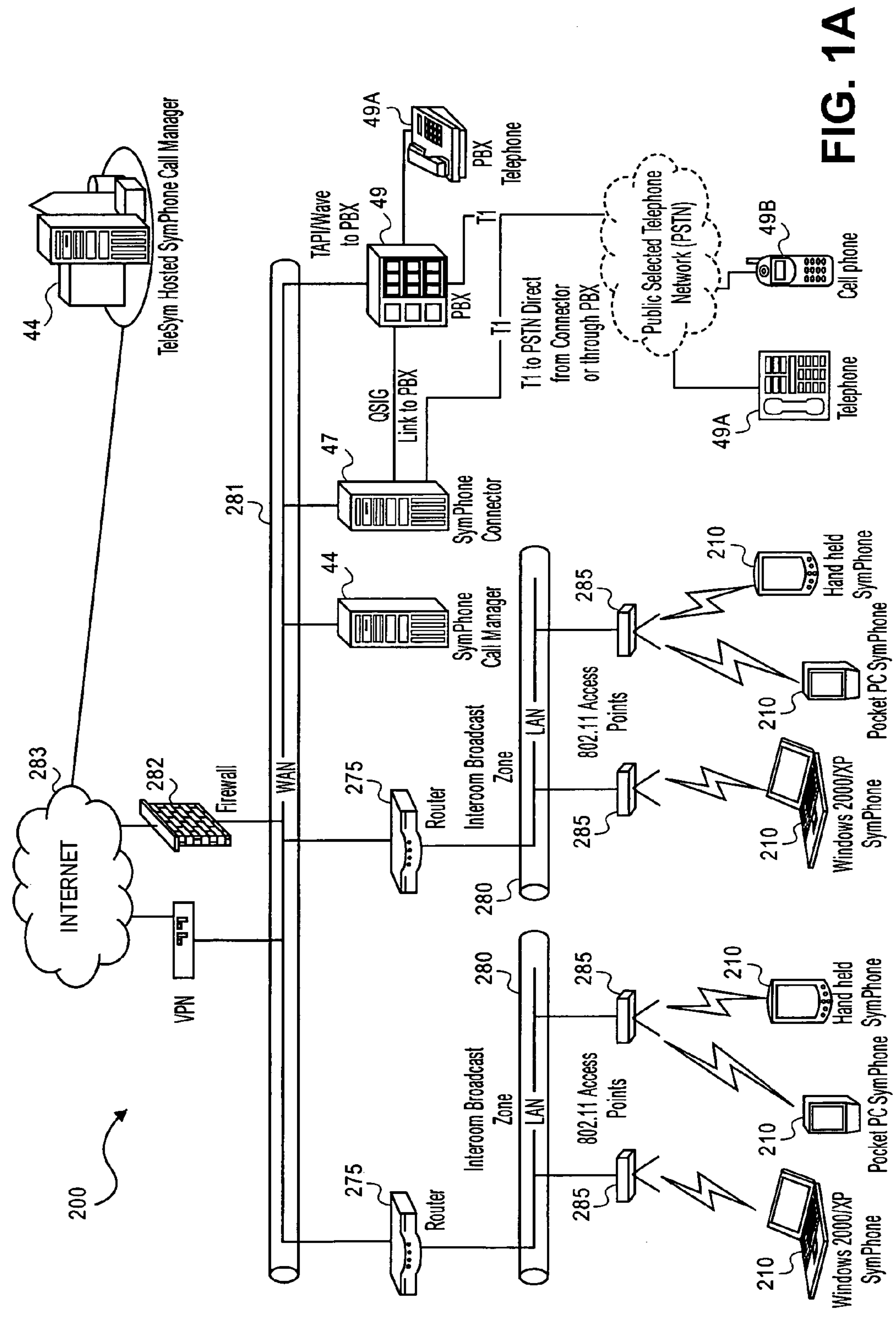
FIGS. 1A and 1B are diagrams illustrating a voice over IP wireless communications system.
Figure 1B:
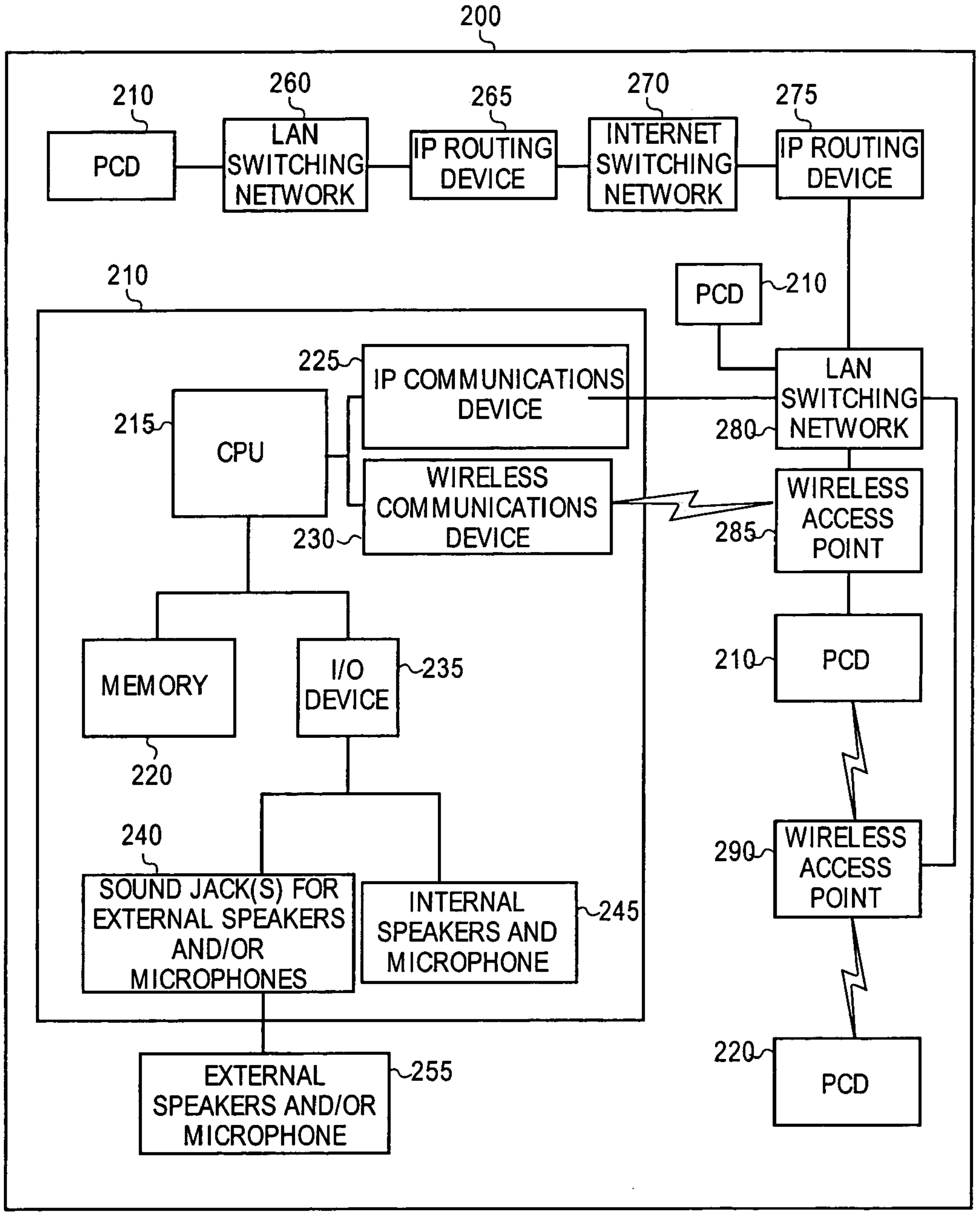

FIGS. 1A and 1B are block diagrams illustrating an exemplary wireless voice over IP communications system. In particular, FIG. 1A is a block diagram illustrating a communications system 200 in accordance with the invention that supports both wired, wireless and voice over IP (VoIP) telephony in accordance with the invention. As shown in FIG. 1A, the system may include one or more computer networks, such as one or more local area networks (LANs) 280 and a wide area network (WAN) 281 wherein each LAN 280 is connected to the WAN 281 via a well known router 275. Each LAN is connected to one or more wireless access points 285 which are in turn connected wirelessly to one or more personal communication devices (PCD) 210. In a preferred embodiment, 802.11 wireless access points are being used. In accordance with the invention, the PCD may comprise a laptop computer, a PocketPC device, a handheld device, a portable digital assistant and/or any other computing devices with sufficient processing power to execute one or more software applications that implement a VoIP phone on the PCD. The PCDs communicate with an access point 285 in order to provide VoIP telephony in which the PCD provides a user interface (such as the example shown in FIG. 2B) that permits the user to make a telephone call using the PCD. The voice of the user is converted into digital form and sent with digital data for the communications session including the digital voice data through the access point 285 and across the LAN 280 (to which the particular access point is connected) to a router 275 and then onto the WAN 281. The digital data for the phone call is then routed to the appropriate location, such as through a firewall 282 to a communications/computer network 283, such as the Internet 283, to a phone call manager 44 hosted by Telesym, or to a call manager 44 attached to the WAN 281 as shown. The call manager 44 may be one or more pieces of software being executed by a computer system, such as a desktop computer or server computer, that processes the VoIP telephone calls. As shown in FIG. 1, the system may further comprise a connector system 47 that links the VoIP system to a PBX 49 through the WAN 281. The connector system 47 may permit typical telephones 49*a* and cellular phones 49*b* to be connected to/from the PCDs 210. Thus, the system permits telephonic communications to occur between a PCD 210 user and another PCD user, between an outside telephone and a PCD user or between a PCD user and an outside telephone.

FIG. 1B depicts a general system architecture 200 for wired and wireless IP telephony. The environment consists of multiple personal communication devices (PCDs) 210 comprising various components that handle sound or video. Each PCD 210 includes a CPU 215 having memory 220 in communication with an IP communication means 225, nominally a LAN Media Access Card (MAC), a wireless communications device 230, which is nominally a IEEE 802.11, Bluetooth, IR or similar compliant standard. The communications device may include LAN, Internet, and other wireless devices.

The PCD 210 further includes an I/O port 235 for audio or video importing and exporting, audio jacks 240 and optionally internal speakers and/or microphone 245, which are all in communication and controlled by CPU 215. The PCD 210 may also include external speakers and a microphone 255. Interactive sound communication occurs in a path from the microphones of one PCD 210 to the speakers of another PCD 210, and vice-versa. Each component may contribute to latency. In addition to the physical components shown in FIG. 1A and FIG. 1B, there may be software components that may also contribute to latency, such as the sound codecs (coder and decoder) that is described in more detail below.

In a typical operation, the PCD 210 connects via a LAN switching network 260/280, such as an Ethernet switch or hub or similar type network device. The LAN 260/280 is normally connected to an IP routing device 265, such as a standard IP standalone router or a PC or similar device configured for routing. The IP routing device 265 is in communication with a communication switching network 270, such as the Internet or other communications network that is further in communication with an IP routing device 275, such as a typical router as described above. As depicted in FIG. 1B, the PCD 210 can be connected to a LAN 280 or wireless access point 285 and 290 either hardwired or via a RF/wireless connection. Now, the personal computing device 210 and its user interface will be described in more detail.

Figure 1C:
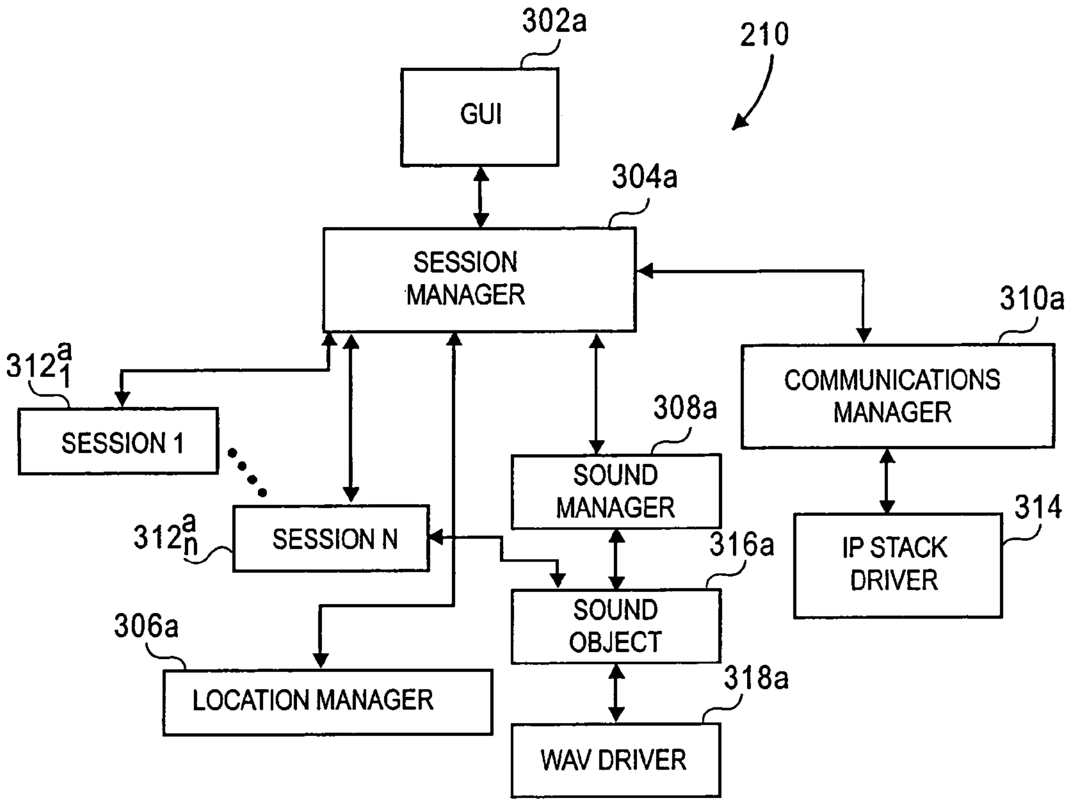
FIG. 1C is a block diagram of a personal communications device that communicates using the wireless voice over IP communications system shown in FIG. 1A.

FIG. 1C is a block diagram of a personal communications device 210 that communicates using the wireless voice over IP communications system shown in FIG. 1A. In FIG. 1C, the logical structure of the PCD is shown as opposed to the physical structure that is shown in FIG. 1B. The blocks shown in FIG. 1C may be collectively referred to as a symphone process that implements the communications system. Each of the elements shown in FIG. 1C may be implemented as one or more pieces of software code being executed by the PCD or each may be an embedded hardware device within the PCD. In a preferred embodiment, the modules described below may be implemented using object oriented software code and be represented as objects. As shown, the PCD may include a graphical user interface module 302*a* that control the user interface displayed to the user, such as that shown in FIG. 1D. The PCD may further include a session manager module 304*a*, a location manager module 306*a*, a sound manager module 308*a* and a communications manager module 310*a*. The session manager module 304*a* controls the overall operation of the communications system and each communications session, such as Session1–SessionN 312$a_1$ to 312$a_n$, and controls the other modules of the system as shown. The communications manager module 310*a* may control the IP communications traffic and protocols, such as by sending commands/receiving data from an IP stack driver 314*a*, of the PCD, communicate the data from the IP stack driver to the session manager and communicate data from the session manager to the IP stack driver. The location manager 306*a* may track the location of each PCD communicating with the particular PCD. The sound manager 308*a* controls and generates the voice/audio data of the PCD and may include, for example, a codec that compresses/decompresses the audio data. To this end, the sound manager 308*a* may generate a sound object 316 that is in turn passed to a wav driver 318*a* that generates the requisite sounds. When there is an active communications session, such as SessionN in FIG. 1C, SessionN may also control the generation of the sound object 316*a*. In accordance with the invention, each PCD may also include a library routine/computer program (not shown) that, upon a request, generates a globally unique random number identifier that is described in more detail below.

Figure 1D:
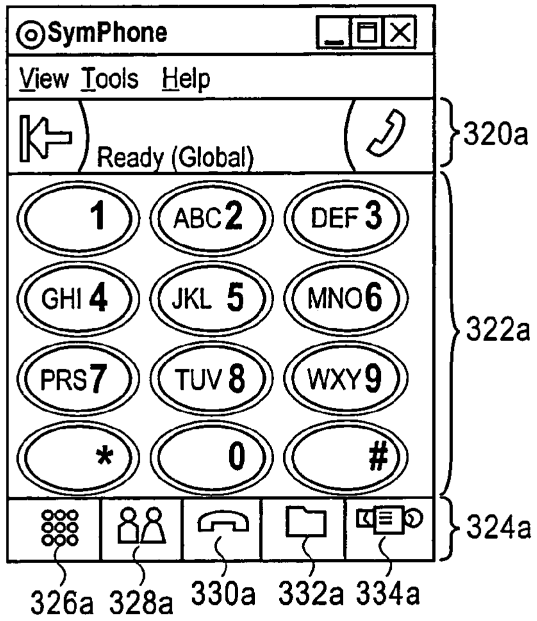
FIG. 1D illustrates an example of the user interface of the personal communications device shown in FIG. 1C.

FIG. 1D is a diagram illustrating an example of the user interface associated with the personal communications device 210 of FIG. 1C. The user interface of the device may include a display portion 320*a*, an interface portion 322*a* (that currently displays a dial pad) and a tasks bar portion 324*a*. The display portion 320*a* displays the status of the device and any active/current calls. The user interface portion 322*a* permits the user to interact with the symphone process and the PCD, such as by entering a telephone number or DTMF generated tones into the device when the dial pad is displayed and the tasks bar portion 324*a* may include a dial pad tab 326*a* (the dial pad tab is selected in FIG. 1D and the dial pad user interface is shown in FIG. 1D), a contacts tab 328*a* that provides a user interface to access a contacts program, a call tab 330*a* to access call information, a file tab 332*a* to store and retrieve files/messages and an intercom tab 334*a* that permits the user to initiate a call with a group of people. Now, the codec in accordance with the invention will be described in more detail.

Figure 2A:
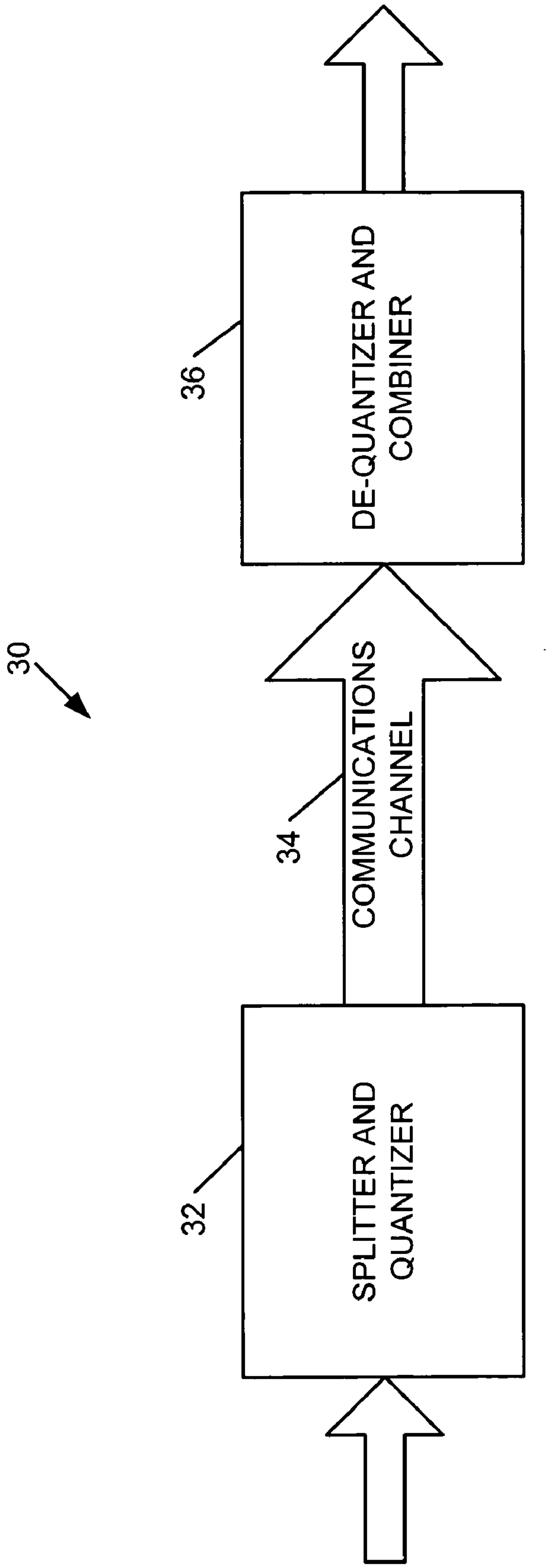
FIG. 2A is a diagram illustrating a codec in accordance with the invention.

FIG. 2A is a diagram illustrating a codec 30 in accordance with the invention. In a preferred embodiment, the codec may be a software-based codec in which the compression and decompression occurs in software modules being executed on a computing resource, such as a personal digital assistant (PDA), a laptop computer, a server and the like. Each of these computing resources has at least a processor, memory and a persistent storage means or device so that the compression software module and decompression software module may be executed by the processor of the computing resource. For example, the codes modules (located in Appendix A) may be stored in a memory of the PCD 210 above and the computer instructions in the codec modules may be executed by the processor of the PCD to implement the codec operations and functions. As shown, the codec 30 may comprise a compression portion 32 and a decompression portion 36. As shown in FIG. 2A, a compression portion 32 compresses sound data and sends it over a communications link 34 to the decompression portion 36 that decompresses the sound data and outputs the sound data. For a particular PCD 210, the compression portion may compress the sound data for outgoing data (whether the call was originated by the PCD or not) and the decompression portion may decompress the incoming sound data to the PCD so that the PCD has both the compression portion and decompression portion within the PCD. In this codec, the compressor portion splits the sound data into a plurality of sub-bands and then quantizes each sub-band signal. The decompression portion 36 receives the quantized sub-bands, de-quantizes each sub-band signal and recombines the sub-band signals into a single sound data stream. The codec is lossy in that it loses some of the information contained in the original sound data. However, as described below in more detail, the quantization noise of the codec is kept low relative to the sub-band amplitude in which it is found. Thus, the quantization noise is typically not noticed by a typical human being due to particular characteristics of the human ear that are well known. Now, the compression portion 32 is described in more detail.

Figure 2B:
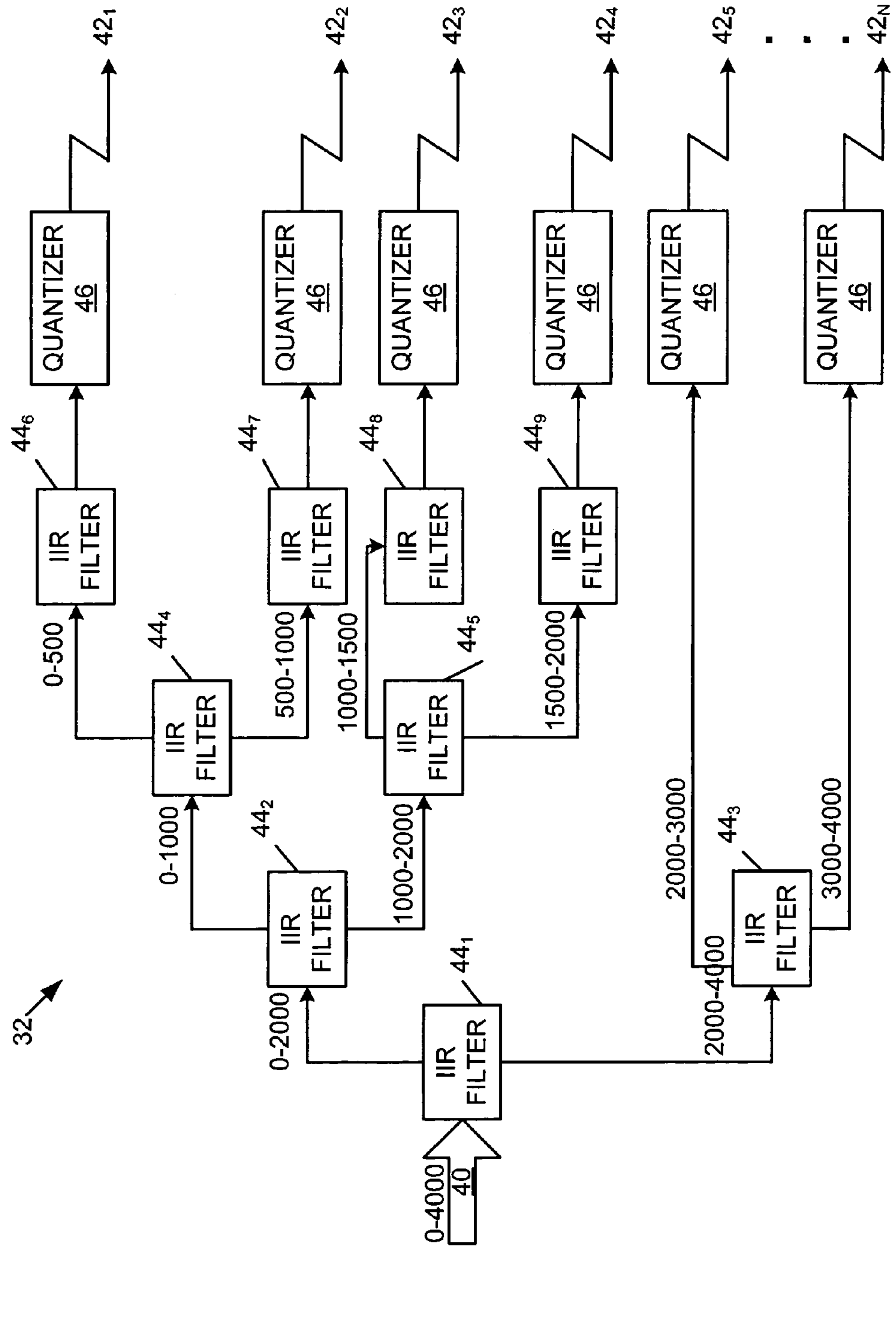
FIG. 2B is a diagram illustrating more details of a compressor in accordance with the invention.

FIG. 2B is a diagram illustrating more details of the compression portion 32 in accordance with the invention. The compression portion 32 receives an incoming sound data stream 40 and outputs one or more quantized sound data sub-band signals, $42_1$ to $42_N$. Each quantized sub-band signal contains a predetermined portion of the original sound data in a particular frequency range (also known as a band). In accordance with the invention, the compression portion 23 comprises a plurality of filters 44 (that are software-implemented filters in the preferred embodiment as disclosed in Appendix A) that split the sound data into the sub-bands. In particular, a first filter 44, splits the original sound data, which may be a signal of 8000 samples (which means a frequency range of 0 to 4000 Hz due to the well known Nyquist theorem) into a band with 0–2000 Hz and a second band with 2000–4000 Hz. The second level of filters 442, 443, then further divide the those sub-bands again so that a band from 0–1000, 0 –2000, 2000–3000 and 3000–4000 Hz are output from the second level of the filters. The third level of the filters (444, 445) further sub-divides the sub-band signals, etc . . . . In this manner, the incoming sound data is divided into a plurality of sub-bands. As shown in FIG. 2B, the compression portion 32 in accordance with the invention does not evenly divide the higher frequency signals and the lower frequency signals. In accordance with the invention, the high frequency signals are sub-divided into larger sub-bands while the lower frequency signals are sub-divided into smaller sub-bands. Thus, in the example shown in FIG. 2B, the sub-bands are 0–500, 500–1000, 1000–1500, 1500–2000, 2000–3000 and 3000–4000 Hz. The lower frequency signals are divided into more sub-bands so that any quantization noise is restricted to those frequencies at which there are sufficient amplitude to mask the quantization noise. In other words, the quantization noise for a large amplitude signal is restricted to the sub-band that contains that large amplitude signal and does not affect the other frequency sub-bands that do not contain that high amplitude signal.

These sub-band signals may then be fed into a plurality of quantizers 46 that quantize each of the sub-band signals. [CAN WE BETTER DESCRIBE THE QUANTIZERS AND THE PREFERRED EMBODIMENT FOR THE QUANTIZER] Since each sub-band signal is quantized separately, the quantization noise is restricted to that frequency sub-band and does not affect the other frequency sub-bands. In a preferred embodiment, each filter 44 may be an infinite impulse response (IIR) filter (also known as a half-band polyphase IIR filter). The characteristics and details of these filters are well known and are described, for example, in a paper by Krukowski, A., I. Kale and R. C. S. Morling entitled, "*The design of polyphase-based IIR multi-band filters", Proc. ICASSP* 97, vol. 3, pp. 2213–2216, Munich, Germany, 20–24 Apr. 1997, which is incorporated herein by reference. The papers cited in the Krukowski are also incorporated herein by reference. The preferred embodiment of the IIR filter is further disclosed in the source code attached as Appendix A. The decompression portion 36 will now be described in more detail.

Figure 2C:
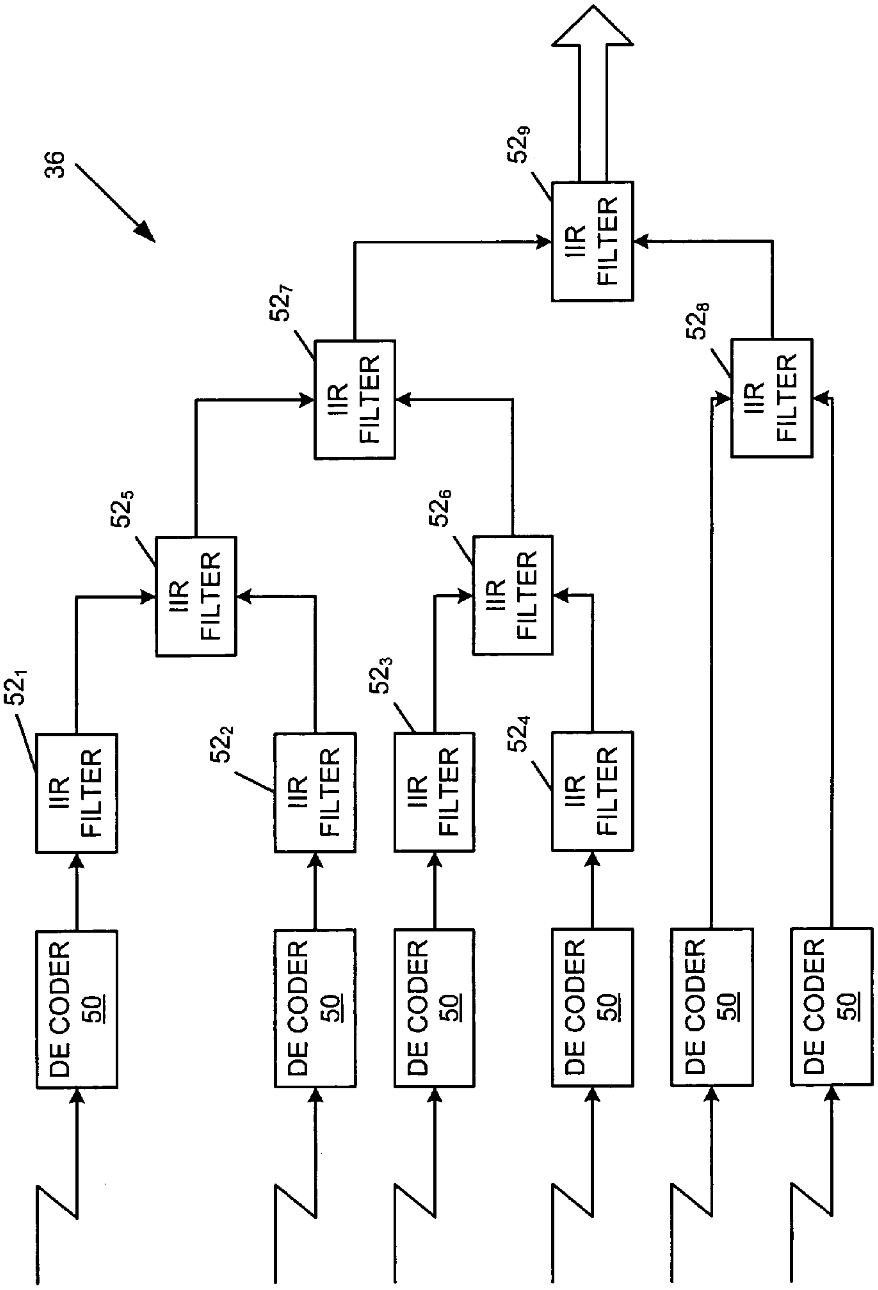
FIG. 2C is a diagram illustrating more details of a decompressor in accordance with the invention.

FIG. 2C is a diagram illustrating more details of the decompression portion 36 in accordance with the invention. Broadly, the decompression portion 36 reverses the process performed by the compression portion in that it reverse quantizes the frequency sub-band signals and then re-combines the frequency sub-bands into the sound data signal. Thus, as shown, the decompression portion 36 may comprise a plurality of reverse quantizer/decoders 50 that decode the signals at each sub-band frequency and then one or more filters 52 (such as filters $52_1$–$52_9$) in a filter bank that recombine the frequency sub-bands into a sound data signal. In accordance with a preferred embodiment of the invention, each filter may be a polyphase half-band IIR filter. In accordance with the invention, the IIR filters in the decompression portion 36 are operated in reverse. In more detail, the IIR filters in the compression portion are run in a normal forwards direction in that data is processed in a time ordered manner while the packets in the decompressor/reconstructor are processed in reverse time order. In addition, the filter state of the filters during the compression process is communicated to the decompression portion. In particular, the IIR filters each contain a state wherein energy is stored in the state. In the preferred embodiment, when decoding/decompression a block, the values of the state variables of the filter as we begin the decoding of the block are a linear combination of the values of the state variables of the filter when the encoding/compression of that block was completed. For example, as shown in FIG. 1B, the state variables of IIR filter $44_6$ as it completes the encoding of a first sound block (block 1) is used as the starting state for the IR filter $52_1$ of the decompressor portion shown in FIG. 1C. In accordance with the invention, this process eliminates the phase shift normally associated with these IIR filters. Furthermore, except for the quantization noise the reconstruction of the original signal is exact.

Figure 3B:
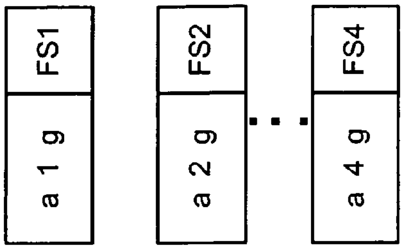
FIG. 3B is a diagram illustrating the sound packets being sent out from the compression portion in accordance with the invention.
Figure 3A:
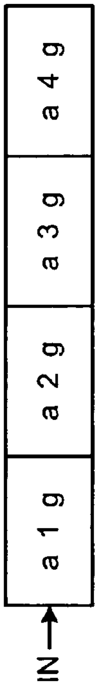
FIG. 3A is a diagram illustrating an example of the sound packet input into the compression portion in accordance with the invention.
Figure 3C:
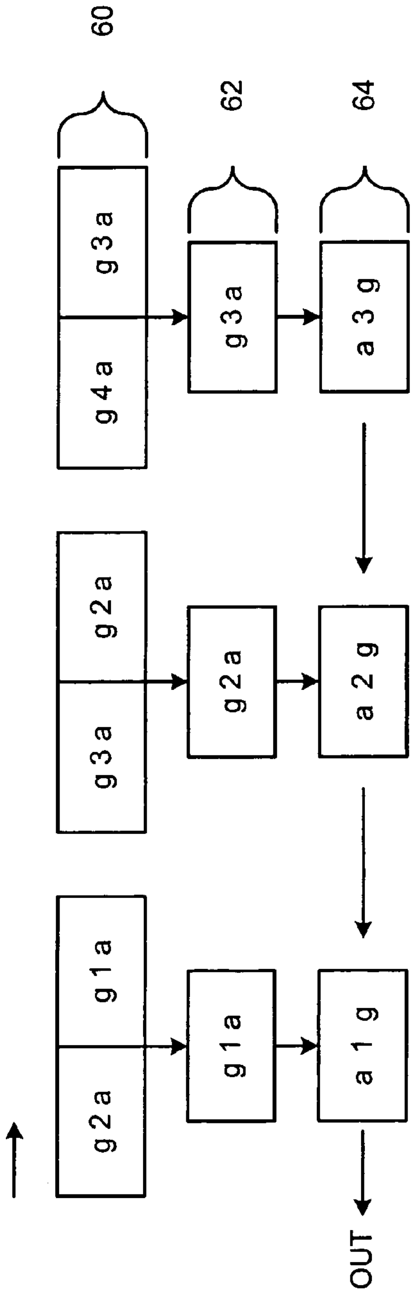
FIG. 3C is a diagram illustrating the reconstruction process for the packets shown in FIG. 3B.

FIG. 3A is a diagram illustrating an example of the sound packet input into the compression portion in accordance with the invention. As shown, the compression process processes four sound packets (1, 2, 3, and 4) in this example wherein each sound packet contains a predetermined number of bits (bits a–g). Those sound packets enter the compression portion in time ordered manner (e.g., packet 1 first, packet 2 second and so on). As shown in FIG. 3B, as a result of the compression process (which split up the frequency sub-bands of the input sound packets), the sound packets are output with an appended filter state portion (FS1, FS2, . . . , FS4) which indicates the state of the filters after the particular sound packet has been processed. FIG. 3C is a diagram illustrating the reconstruction process for the packets shown in FIG. 3B. As mentioned above, the reconstruction process reassembles the frequency sub-bands for each sound packet to produce each sound packet. During the reconstruction process, the first two packets (1 and 2) are reversed in time order (including the bits in each sound packet) in step 60 as shown. This process occurs for every two sound packets. For each of these pair of sound packets, the IIR filter processes these packets to generate a single packet (packet 1 in this example, then packet 2 and finally packet 3) in step 62 wherein the bits of the generated packet are reversed. In step 64, the bits for the generated packet are reversed to produce the desired sound packet. More details of this method for reconstruction in accordance with the invention are disclosed in Appendix A that contains the source code of the decompression method.

While the foregoing has been with reference to a particular embodiment of the invention, it will be appreciated by those skilled in the art that changes in this embodiment may be made without departing from the principles and spirit of the invention as defined in the attached claims.

What is claimed is:

1. An apparatus for compressing a data stream, the apparatus comprising:

a first level bank of filters to separate a data stream into a higher frequency portion and a lower frequency portion;

a second level bank of filters to separate the higher frequency data stream portion into a first plurality of sub-band portions and to separate the lower frequency data stream portion into a second plurality of sub-band portions, wherein the lower frequency portion is divided into more sub-bands than the higher frequency portion; and a plurality of quantizers wherein each quantizer receives a particular sub-band from a particular filter, the quantizer quantizing the particular sub-band signal to generate a sub-band quantized signal wherein the signals of the plurality of quantizers are combined together to form a compressed output signal.

2. The apparatus of claim 1, wherein the data stream further comprises audio data.

3. The apparatus of claim 1, wherein the higher frequency portion further comprises a frequency range of 2000–4000 Hz and wherein the lower frequency portion further comprises a frequency range of 0–2000 Hz.

4. The apparatus of claim 3, wherein the lower frequency sub-bands further comprise a 0–500 Hz subband, a 500–1000 Hz subband, a 1000–1500 Hz subband and a 1500–2000 Hz subband and wherein the higher frequency sub-bands further comprise a 2000–3000 Hz subband and a 3000–4000 Hz subband.

5. The apparatus of claim 1, wherein each filter further comprises an infinite impulse response filter.

6. The apparatus of claim 1, wherein each filter further comprise a software-implemented filter and wherein each quantizer further comprises a software-implemented quantizer.

7. A method for compressing a data stream, the method comprising:

separating a data stream having a higher frequency portion and a lower frequency portion, using a first bank of filters:

separating the higher frequency portion into a first plurality of sub-bands and separating the lower frequency portion into a second plurality of sub-bands, wherein the lower frequency portion is divided into more sub-bands than the higher frequency portion;

quantizing each sub-band signal to generate a sub-band quantized signal having quantizer noise wherein the quantizer noise for a particular sub-band signal is masked by the amplitude of the signal in the sub-band and wherein the sub-band quantized signals of the plurality of quantizers are combined together to form a compressed output signal.

8. The method of claim 7, wherein the data stream further comprises audio data.

9. The method of claim 7, wherein separating the data stream further comprises generating the higher frequency portion having a frequency of 2000–4000 Hz and generating the lower frequency portion having a frequency of 0–2000 Hz.

10. The method of claim 9, wherein the lower frequency sub-bands further comprise a 0–500 Hz subband, a 500–1000 Hz subband, a 1000–1500 Hz subband and a 1500–2000 Hz subband and wherein the higher frequency sub-bands further comprise a 2000–3000 Hz subband and a 3000–4000 Hz subband.

11. An apparatus for decompressing a compressed data stream having a plurality of quantized frequency sub-bands, the apparatus comprising:

a plurality of decoders wherein each decoder receives a particular quantized frequency sub-band of the compressed data stream, each decoder reverse quantizing the particular quantized frequency sub-band to generate a decoded frequency sub-band signal wherein the quantizer noise for a particular sub-band signal is masked by the amplitude of the signal in the sub-band and wherein the plurality of decoders generate a plurality of decoded frequency sub-band signals at a plurality of sub-bands; and a bank of filters wherein the bank of filters reconstruct the plurality of decoded frequency sub-band signals at a plurality of sub-bands into an uncompressed data stream wherein each sub-band signal comprises a portion of the data stream within a particular frequency range so that the plurality of sub-bands cover the frequency range of the data stream and wherein a lower frequency portion is divided into more sub-bands than a higher frequency portion, each filter receives a filter state from the compressed data stream in order to reconstruct a sequence of data packets in the particular decoded frequency sub-band signal in reverse order to generate the uncompressed data stream.

12. The apparatus of claim 11, wherein the data stream further comprised audio data.

13. The apparatus of claim 11, wherein the higher frequency portion further comprises 2000–4000 Hz and wherein the lower frequency portion further comprises 0 –2000 Hz.

14. The apparatus of claim 13, wherein the lower frequency sub-bands further comprise a 0–500 Hz subband, a 500–1000 Hz subband, a 1000–150 Hz subband and a 1500–2000 Hz subband and wherein the higher frequency sub-bands further comprise a 2000–3000 subband and a 3000–4000 Hz subband.

15. The apparatus of claim 11, wherein each filter further comprises an infinite impulse response filter.

16. The apparatus of claim 11, wherein each filter further comprise a software-implemented filter and wherein each quantizer further comprises a software-implemented quantizer.

17. A method for decompressing a compressed data stream having a plurality of quantized frequency sub-bands, the method comprising:

decoding, using reverse quantization, a particular quantized frequency subband of the compressed data stream to generate a decoded frequency sub-band signal wherein the quantizer noise for a particular sub-band signal is masked by the amplitude of the signal in the sub-band and wherein the plurality of decoders generate a plurality of decoded frequency sub-band signals at a plurality of sub-bands; and reconstructing, using a bank of filters, the plurality of decoded frequency sub-band signals at a plurality of sub-bands into an uncompressed data stream wherein each sub-band signal comprises a portion of the data stream within a particular frequency range so that the plurality of sub-bands cover the frequency range of the data stream and wherein a lower frequency portion is divided into more sub-bands than a higher frequency portion, each filter receives a filter state from the compressed data stream in order to reconstruct a sequence of data packets in the particular decoded frequency sub-band signal in reverse order to generate the uncompressed data stream.

18. The method of claim 17, wherein the data stream further compresses audio data.

19. The method of claim 17, wherein reconstructing the data stream further comprises generating the higher frequency data stream having a frequency of 2000–4000 Hz and generating the lower frequency data stream having a frequency of 0–2000 Hz.

20. The method of claim 19, wherein the lower frequency sub-bands further comprise a 0–500 Hz subband, a 500–1000 Hz subband, a 1000–1500 Hz subband and a 1500–2000 Hz subband and wherein the higher frequency sub-bands further comprise a 2000–3000 Hz subband and a 3000–4000 Hz subband.

21. A personal computing device for use within a communications network, the device comprising:

a communications application, being executed by a processor of the personal computing device, that can establish a communication session with a communications application of another personal computing device over a communications network;

a sound manager module, part of the communications application that receives outgoing sound data and incoming sound data, the sound manager module having a codec with a compression module and a decompression module, a first bank of filters, part of the compression module wherein the bank of filters separate a data stream having a higher frequency portion and a lower frequency portion;

a second bank of filters, part of the compression module, to separate the higher frequency portion into a first plurality of sub-band portions and to separate the lower frequency portion into a second plurality of sub-band portions, wherein the plurality of sub-bands cover the frequency range of the data stream and wherein the lower frequency portion is divided into more sub-bands than the higher frequency portion; and a plurality of quantizers wherein each quantizer receives a particular sub-band from a particular filter, the quantizer quantizing the particular sub-band signal to generate a sub-band quantized signal having quantizer noise wherein the quantizer noise for a particular sub-band signal is masked by the amplitude of the signal in the sub-band and wherein the sub-band quantized signals of the plurality of quantizers are combined together to form a compressed output signal; and the decompression module further comprises a plurality of decoders that receive a compressed data stream wherein each decoder receives a particular quantized frequency sub-band of the compressed data stream, each decoder reverse quantizing the particular quantized frequency sub-band to generate a decoded frequency sub-band signals at a plurality of sub-bands; and a bank of filters wherein the bank of filters reconstruct the plurality of decoded frequency sub-band signals at a plurality of sub-bands into an uncompressed data stream having a plurality of frequencies corresponding to the frequencies of the sub-band signals wherein each filter receives a filter state from the compressed data stream in order to reconstruct a sequence of data packets in the particular decoded frequency sub-band signal in reverse order to generate the uncompressed data stream.

22. The device of claim 21, wherein the data stream further comprises audio data.

23. The device of claim 21, wherein the higher frequency portion further comprises 2000–4000 Hz and wherein the lower frequency portion further comprises 0 –2000 Hz.

24. The device of claim 23, wherein the lower frequency sub-bands further comprise a 0–500 Hz subband, a 500–1000 Hz subband, a 1000–1500 Hz subband and a 1500–2000 Hz subband and wherein the higher frequency sub-bands further comprise a 2000–3000 Hz subband and a 3000–4000 Hz subband.

25. The device of claim 21, wherein each filter further comprises an infinite impulse response filter.

26. The device of claim 21, wherein each filter further comprise a software-implemented filter and wherein each quantizer further comprises a software-implemented quantizer.

* * * * *